United States Patent [19]

Sakata

[11] Patent Number: 5,781,482
[45] Date of Patent: Jul. 14, 1998

[54] SEMICONDUCTOR MEMORY DEVICE

[75] Inventor: Toshikazu Sakata, Miyazaki, Japan

[73] Assignee: Oki Electric Industry Co., Ltd., Tokyo, Japan

[21] Appl. No.: 829,284

[22] Filed: Mar. 31, 1997

[30] Foreign Application Priority Data

Jul. 8, 1996 [JP] Japan ................................. 8-177836

[51] Int. Cl.[6] ........................................................ G11C 7/00
[52] U.S. Cl. .................. 365/189.11; 365/154; 365/149; 365/189.09
[58] Field of Search ........................... 365/154, 156, 365/149, 189.09, 189.11

[56] References Cited

U.S. PATENT DOCUMENTS 5,517,445  5/1996  Imai .................................. 365/145
5,574,695  11/1996 Suzuki ........................... 365/189.11
5,646,885  7/1997  Matsuo .............................. 365/154

FOREIGN PATENT DOCUMENTS

2-89288  3/1990  Japan.

*Primary Examiner*—Joseph A. Popek
*Assistant Examiner*—Son Mai
*Attorney, Agent, or Firm*—Jones & Volentine, L.L.P.

[57] ABSTRACT

A semiconductor memory having a function that set/reset information is directly written into each of the memory cells is disclosed. The semiconductor memory device of the present invention comprises word lines, bit lines, set/reset lines and switch circuits each of which is coupled to one of the set/reset lines for applying either a first potential or a second potential in response to a control signal. The semiconductor memory device further includes memory cells for storing data therein. Each of the memory cells has a first node coupled to one of the word lines, a second node coupled to one of the bit lines, a third node coupled to receive the first potential, and a forth node coupled to one of the set/reset lines.

17 Claims, 5 Drawing Sheets

SEMICONDUCTOR MEMORY DEVICE

BACKGROUND OF THE INVENTION

1. Field of the Invention:

This invention relates to a random-erasable semiconductor memory device composed of an assembly of cells capable of storing one bit therein. The present invention particularly relates to a semiconductor memory device having a set device and/or reset device for writing a predetermined value into each memory cell.

2. Description of the Related Art:

In a static random access memory, a row decoder for selecting a word line is provided with gates used for a set and/or reset function. The gates can control a bit line pair in a manner similar to the normal writing so as to set and/or reset information to a predetermined value. However, since the excessive gates are inserted for the set/reset operation, an access speed at the time of a normal write or read operation is reduced. Further, the gates control the bit line pair even upon set/reset operation, their control becomes complex.

As a memory device capable of avoiding such a problem, there is known one which has heretofore been disclosed in, for example, Japanese Patent Application Laid-Open No. 2-89288. However, the memory device having the above configuration has a problem in that since the present memory device is intended to be applied only to a dual-port memory device, each memory cell is composed of a pair of high resistances and six MOS transistors, thus resulting in an increase in layout area.

SUMMARY OF THE INVENTION

With the forgoing in view, it is an object of the present invention to provide a semiconductor memory having a function that set/reset information is directly written into each of the memory cells.

In order to achieve the above object, a semiconductor memory device of the present invention comprises word lines, bit lines, set/reset lines and switch circuits each of which is coupled to one of the set/reset lines for applying either a first potential or a second potential in response to a control signal. The semiconductor memory device of the present invention further includes memory cells for storing data therein. Each of the memory cells has a first node coupled to one of the word lines, a second node coupled to one of the bit lines, a third node coupled to receive the first potential, and a forth node coupled to one of the set/reset lines.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
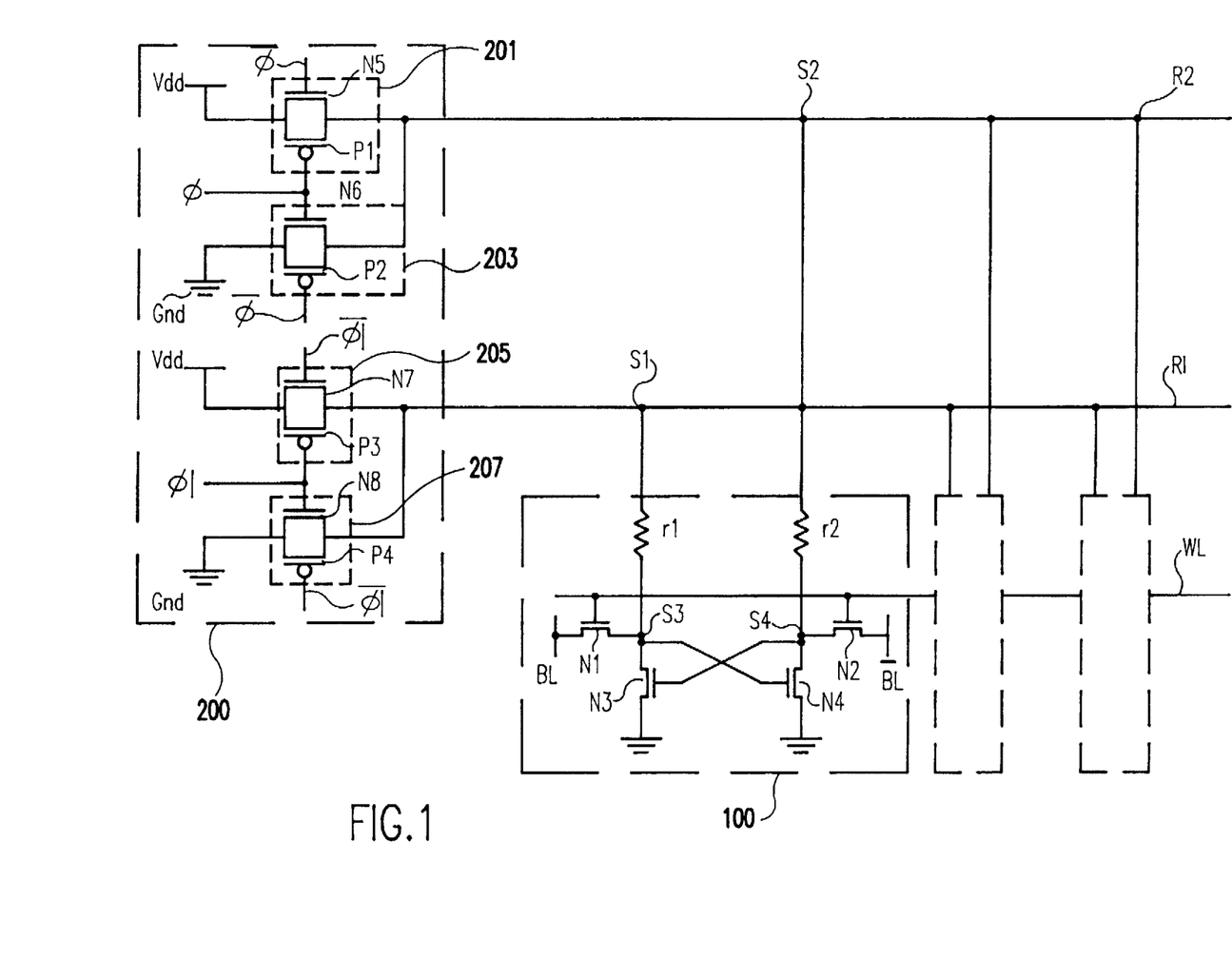
FIG. 1 is a circuit diagram of an SRAM device showing a first embodiment according to the present invention.

FIG. 1 is a circuit diagram showing a principal part of a first embodiment according to the present invention. FIG. 1 specifically illustrates a number of SRAM memory cells disposed within a memory core region in row and column, set/reset lines R1 and R2 disposed so as to correspond to respective word lines WL, and a plurality of switch circuits A respectively disposed around an SRAM device so as to correspond to the set/reset lines R1 and R2.

Each of the SRAM memory cells 100 shown in FIG. 1 is a high resistance load type SRAM memory cell. Load resistances r1 and r2 provided in a pair are respectively electrically connected between connecting nodes S1 and S2 of the set/reset lines R1 and R2 and memory cell nodes S3 and S4. The sources of a pair of input/output N channel MOS transistors N1 and N2 are electrically connected to their corresponding memory cell nodes S3 and S4, the drains thereof are respectively electrically connected to a pair of bit lines BL and BL and the gates thereof are electrically connected to a common word line WL. The gates and drains of a pair of drive N channel MOS transistors N3 and N4 are respectively electrically cross-connected to each other at the memory cell nodes S3 and S4. The sources thereof are respectively electrically connected to a ground potential so as to serve as a flip-flop.

Each of the switch circuit 200 includes four CMOS switches 201, 203, 205 and 207 respectively composed of N channel MOS transistors N5 through N8 and P channel MOS transistors P1 through P4 as pairs. The gates of the transistors that constitute each of the CMOS switches, are supplied with control signals $\phi$ and $\bar{\phi}$ or $\phi_1$ and $\bar{\phi}_1$ having opposite phases.

If each of the control signals $\phi$ and $\phi_1$ is an "H" level, then the CMOS switches 201 and 205 supply a source potential Vdd to their corresponding set/reset lines R1 and R2. If the control signals $\phi$ and $\phi_1$ are both an "L" level, then the CMOS switches 203 and 207 supply a ground potential Gnd to their corresponding set/reset lines R and R2. Incidentally, the control signal $\phi$ is asynchronous to the control signal $\phi_1$.

The operation of the SRAM device shown in FIG. 1 will now be described below. When the SHAM device is activated in a normal mode such as the writing of information to each memory cell and reading of it therefrom, the control signal $\phi$ is set to the "L" level and the control signal $\phi_1$ is set to the "L" level. Since the CMOS switches 201 and 205 are turned on, the source potential Vdd is supplied to the connecting nodes Si and S2 through the set/reset lines R1 and R2. Thus, the SHAM memory cell 100 is activated as the high resistance load type SRAM memory.

A mode for setting or resetting the SRAM memory cell 100 will next be described. Now consider that when the memory cell node S3 is maintained at an "L" level and the memory cell node S4 is maintained at an "H" level, the SRAM memory cell 100 stores "1" therein, whereas when they work in reverse, the SRAM memory cell 100 stores "0" therein. When it is desired to set "1" to the SPAM memory cell 100, all the word lines WL are first brought into a non-selected state and then the transistors N1 and N2 are turned off. Thereafter, the control signals φ and φ₁ are respectively set to the "L" and "H" levels. In doing so, the CMOS switch 207 is turned on so that an "L" level is applied to the connecting node S1. As a result, the "L" level is applied to the memory cell node S3. Since the memory cell node S4 is supplied with the "H" level, the transistor N3 is brought to a further on-state so that the memory cell node S3 is set to a less reduced "L" level.

If the control signal φ₁ is returned or restored to the "L" level in this condition, then the memory cell node S3 is held at the "L" level and the memory cell node S4 is maintained at the "H" level. As a result, the operation of writing of "1" into the SRAM memory cell 100, i.e., its set operation is completed.

Upon writing of "0" into the SRAM memory cell 100, i.e., resetting it, the control signal φ₁ and φ are respectively set to the "L" and "H" levels while all the word lines WL are respectively being kept in a non-selected state. Further, the CMOS switch 203 is turned on so that the connecting node S2 and the memory cell node S4 are respectively supplied with an "L" level. The reset operation is completed by restoring the control signal φ to the "L" level after the elapse of a predetermined time interval.

Figure 2:
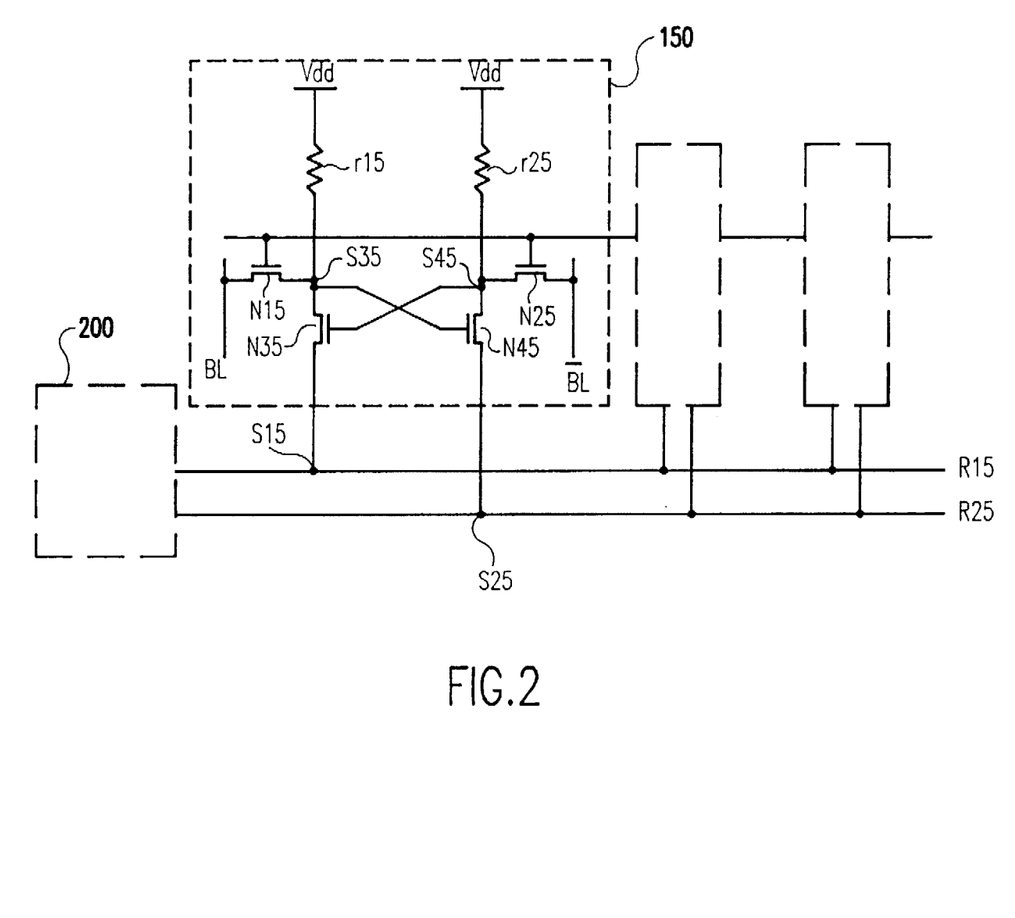
FIG. 2 is a circuit diagram of an SRAM device illustrating a second embodiment according to the present invention.

FIG. 2 is a circuit diagram showing a second embodiment of a SRAM device according to the present invention. A SRAM memory cell 150 shown in FIG. 2 is substantially identical in configuration to the SRAM memory cell 100 shown in FIG. 1. The SRAM memory cell 150 is different from the SRAM memory cell 100 shown in FIG. 1 in that the sources of drive NMOS transistors N35 and N45 are electrically connected to their corresponding connecting nodes S15 and S25 and ones of load resistances rl5 and r25 are respectively electrically connected to a source potential Vdd.

The operation of the SRAM device shown in FIG. 2 will now be described. When the SRAM device is activated in a normal mode such as the writing of information to each memory cell and reading of it therefrom, a switch circuit 200 supplies a ground potential Gnd to a pair of set/reset lines R15 and R25 so that the SRAM memory cell 150 is activated as a normal high resistance load type SRAM memory cell.

All the word lines WL are first brought into a non-selected state upon setting "1" to the SRAM memory cell 150. Thereafter, the switch circuit 200 supplies the ground potential Gnd to the set/reset line R15, i.e., the memory cell node S15 and supplies the source potential Vdd to the connecting node S25 through the set/reset line R25. Thus, the source of the transistor N45 is electrically connected to the source potential Vdd and the drain thereof is also electrically connected to the source potential Vdd through the load resistance r25. Therefore, the potential at a memory cell node S45 is raised to turn on the transistor N35 so that the memory cell node S35 is brought to a less reduced "L" level.

If the potential at the set/reset line R25 is restored to its original ground potential Gnd in this condition, then the memory cell node S35 is maintained at an "L" level and the memory cell node S4 is held at an "H" level, whereby the writing of "1" into the SRAM memory cell 150, i.e., the set operation thereof is terminated.

Upon writing of "0" into the SPAM memory cell 150, i.e., resetting it, the switch circuit 200 is activated so as to supply the ground potential Gnd to the set/reset line R15 and supply the source potential Vdd to the set/reset line R25 while all the word lines WL are respectively being placed in a non-selected state. Thus, the memory cell node S35 is supplied with an "H" level and the memory cell node S45 is supplied with an "L" level. Thereafter, the potential at the set/reset line R25 is restored to its original ground potential Gnd to complete the reset operation.

According to the first and second embodiments as described above, since the information to be written into the memory cell is directly written into its corresponding transistors in the memory cell, the set or reset state in the memory cell can be realized without an increase in the number of elements, i.e., an increase in layout area. Further, the set or reset state ("H" level or "L" level) within each memory cell can be arbitrarily set by a combination of the control signals φ and φ₁.

Figure 3:
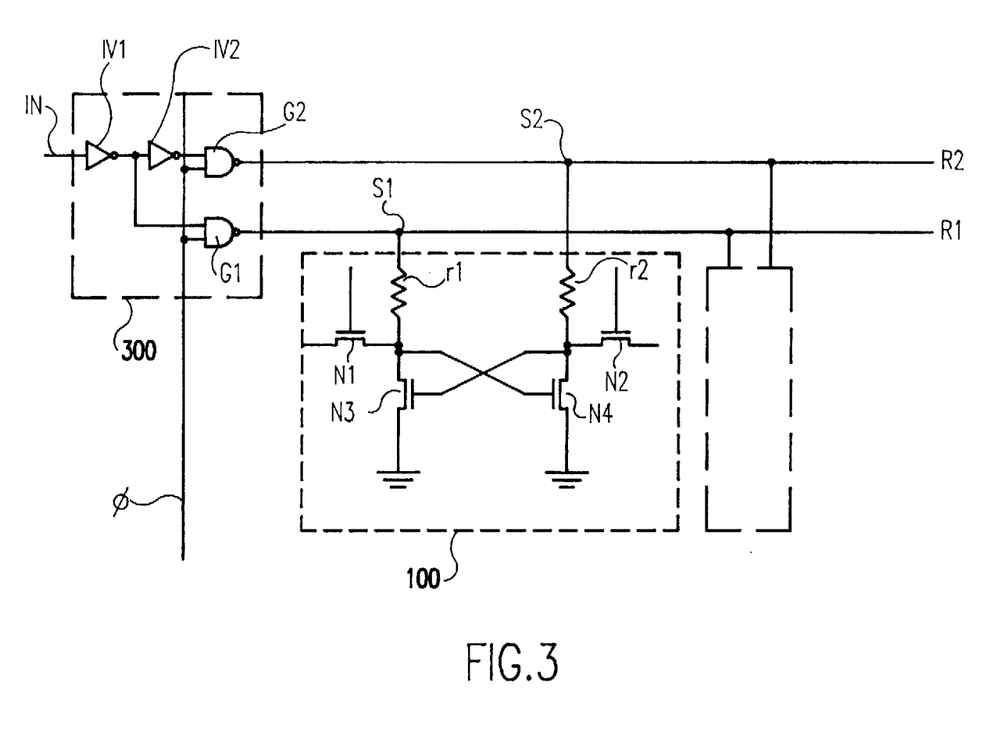
FIG. 3 is a circuit diagram of an SRAM device showing a third embodiment according to the present invention.

FIG. 3 is a circuit diagram showing a third embodiment of a SRAM device according to the present invention. The circuit shown in FIG. 3 is different from that shown in FIG. 1 only in that a logical circuit 300 is adopted in place of the switch circuit 200 shown in FIG. 1.

The logical circuit 300 shown in FIG. 3 comprises inverters IV1 and IV2 and NAND gates G1 and G2 and is controlled by a set/reset input signal IN and a control signal φ. The logical circuit 300 supplies a source potential Vdd to a pair of set/reset lines R1 and R2. Alternatively, the logical circuit 300 supplies the source potential Vdd to one set/reset line R2 and supplies a ground potential Gnd to the other set/reset line R1. Or the logical circuit 300 supplies the ground potential Gnd to one set/reset line R2 and supplies the source potential Vdd to the other set/reset line R1.

The operation of the SRAM device shown in FIG. 3 will now be described. When the SRAM device is activated in a normal mode such as the writing of information into each memory cell and reading of it therefrom, the control signal φ is set to an "L" level.

In doing so, the set/reset lines R1 and R2 are respectively supplied with the source potential Vdd so that the SRAM memory cell is activated as a normal high resistance load type SRAM memory cell in a manner similar to FIG. 1.

If all the word lines WL are respectively brought into a non-selected state and the set/reset signal IN and the control signal φ₁ are respectively set to an "H" level, then the source potential Vdd is supplied to the set/reset line R1 and the ground potential Gnd is supplied to the set/reset line R2, whereby the writing of "0" into each memory cell, i.e., its reset is carried out.

On the other hand, if the set/reset signal IN is rendered "L" in level and the control signal φ is rendered "H" in level, then the set/reset line R1 and the set/reset line R2 are respectively supplied with the ground potential Gnd and the source potential Vdd so that the writing of "1" into the corresponding memory cell, i.e., its set is carried out.

Figures 4, 5:
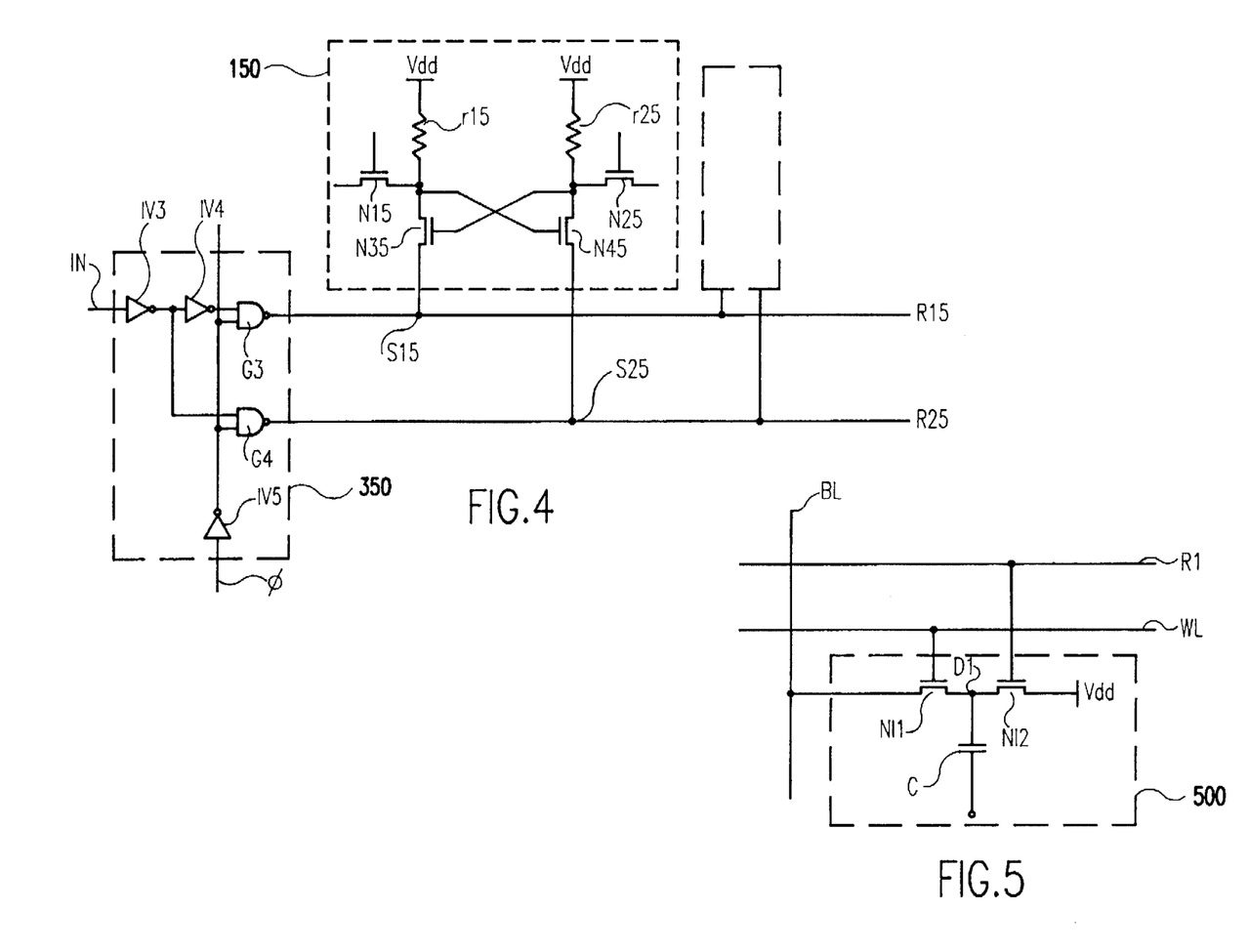
FIG. 4 is a circuit diagram of an SRAM device illustrating a fourth embodiment according to the present invention.
FIG. 5 is a circuit diagram of a DRAM device showing a fifth embodiment according to the present invention.

FIG. 4 is a circuit diagram showing a fourth embodiment of a SRAM device according to the present invention. The SRAM device shown in FIG. 4 is different from that shown in FIG. 2 only in that a logical circuit 350 is adopted in place of the switch circuit 200 shown in FIG. 2.

The logical circuit 350 shown in FIG. 4 comprises inverters IV3, IV4 and IV5 and NOR gates G3 and G4 and is controlled by a set/reset input signal IN and a control signal φ. The logical circuit 350 supplies a ground potential Gnd to a pair of set/reset lines R1 and R2. Alternatively, the logical circuit 350 supplies a source potential Vdd to one set/reset line R2 and supplies the ground potential Gnd to the other set/reset line R1. Or the logical circuit 350 supplies the ground potential Gnd to one set/reset line R2 and supplies the source potential Vdd to the other set/reset line R1.

The operation of the SKAM device shown in FIG. 4 will now be described. When the SRAM device is activated in a normal mode such as the writing of information into each memory cell and reading of it therefrom, the control signal φ is set to an "L" level. In doing so, the set/reset lines R1 and R2 are respectively supplied with the ground potential Gnd so that the SRAM memory cell is activated as a normal high resistance load type SRAM memory cell in a manner similar to FIG. 2.

If all the word lines WL are respectively placed in a non-selected state and the set/reset signal IN and the control signal φ are respectively set to an "H" level, then the ground potential Gnd is supplied to the set/reset line R1 and the source potential Vdd is supplied to the set/reset line R2, whereby the writing of "1" into each memory cell, i.e., its set is carried out.

On the other hand, the control signal $\phi_1$ is set to the "H" level while the set/reset signal IN remains held at an "L" level. Thus, the set/reset line R1 and the set/reset line R2 are respectively supplied with the source potential Vdd and the ground potential Gnd so that the writing of "0" into the memory cell, i.e., its reset is carried out.

According to the third and fourth embodiments as described above, the set or reset state in the memory cell can be realized without an increase in the number of elements, i.e., an increase in layout area in a manner similar to the first and second embodiments. Further, the set or reset state within each memory cell can be arbitrarily set by applying the "H" or "L" level to the signal IN.

Incidentally, the first, second, third and fourth embodiments have described the high resistance load type SRAM memory cell. However, they can be also applied to a CMOS type SRAM cell. Although the switch circuit and the logical circuit have been described as ones carrying out the set and reset operations, they may be also used specifically for setting or resetting.

FIG. 5 is a circuit diagram showing a fifth embodiment in which the present invention is applied to a DRAM device. In the same drawing, one memory cell is illustrated. In the DRAM device shown in FIG. 5, one set/reset line R1 is provided so as to correspond to respective word lines WL. Each DRAM memory cell 500 comprises an input/output N channel MOS transistor N11 whose drain, gate and source are respectively electrically connected to a bit line BL, a word line WL and a memory cell node D1, a storage capacitor C whose one end is electrically connected to the memory cell node D1, and a set/reset N channel MOS transistor N12 whose source-to-drain path is provided in series between the memory cell node D1 and the source potential Vdd and whose gate is electrically connected to the set/reset line R1.

The configuration of the DRAM memory cell 500 has been disclosed in FIG. 4 described in Japanese Patent Application Laid-Open No. 57-69589, for example. In the present application, a memory cell shown in FIG. 4 is used as a reference cell MR and an electrical charge is written into a memory cell MC selected upon refresh through a sense amplifier SA.

In order to perform such an operation, one reference cell MR may be provided between one ends of respective data lines D and D. Further, the reference cell MR does not operate as a normal memory cell. That is, the reference cell MR does not store data therein.

However, in the fifth through eighth embodiments according to the present invention, the memory cells 500 through 800 each having the transistors N12 and P11 electrically connected to their corresponding set/reset lines R1 and R2 are also activated as the normal memory cells. That is, the memory cells 500 through 800 store data therein. Similarly, the above can be applied to the first through fourth embodiments. However, the memory cell with the set/reset function may be applied to all the memory cells of each memory device but only to a required part thereof.

The operation of the DRAM device shown in FIG. 5 will now be described. When the DRAM device shown in FIG. 5 is activated in a normal mode such as the writing of information into the memory cell and reading of it therefrom, a ground potential Gnd is supplied to the set/reset line R1 so as to bring the transistor N12 into a non-conducting state. Upon setting of the memory cell, all the word lines are brought into a non-selected state and the set/reset line R1 is supplied with the source potential Vdd.

When the set/reset line R1 is supplied with the source potential Vdd so as to be brought to an "H" level, the transistor N12 is brought into conduction. As a result, the "H" level is supplied to the memory cell node D1 from the source of the transistor N12 to set "1" to the memory cell. Thereafter, the operation of the DRAM device shown in FIG. 5 is terminated after the potential at the set/reset line R1 has been restored to its original ground potential.

Figure 6:
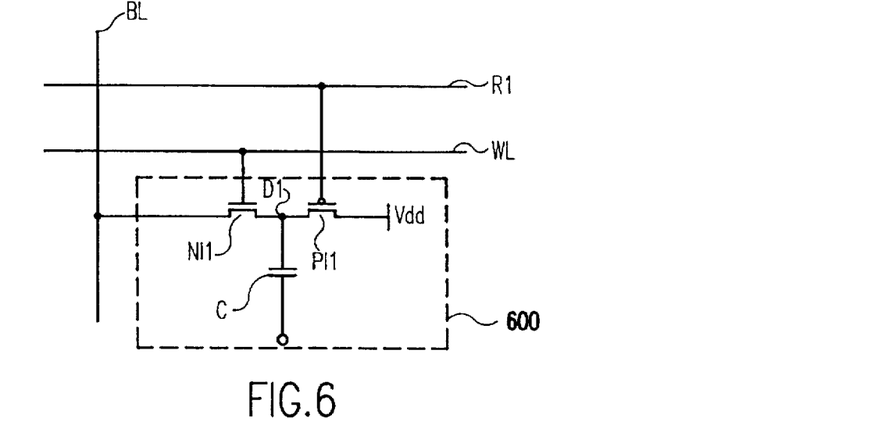
FIG. 6 is a circuit diagram of a DRAM device illustrating a sixth embodiment according to the present invention.

FIG. 6 is a circuit diagram showing a sixth embodiment in which the present invention is applied to a DRAM device. In the present embodiment, a memory cell 600 is configured in such a manner that a P channel MOS transistor 11 is provided therein and the drain, source and gate thereof are respectively electrically connected to a memory cell node D1, a source potential Vdd and a set/reset line R1.

When the DRAM device shown in FIG. 6 is activated in a normal mode, the set/reset line R1 is supplied with the source potential Vdd. On the other hand, when the set/reset line R1 is supplied with a ground potential Gnd, a transistor P11 is turned on to supply an "H" level to the memory cell node D1 from the source of the transistor P11, whereby the setting of "1" to the memory cell is performed.

Figure 7:
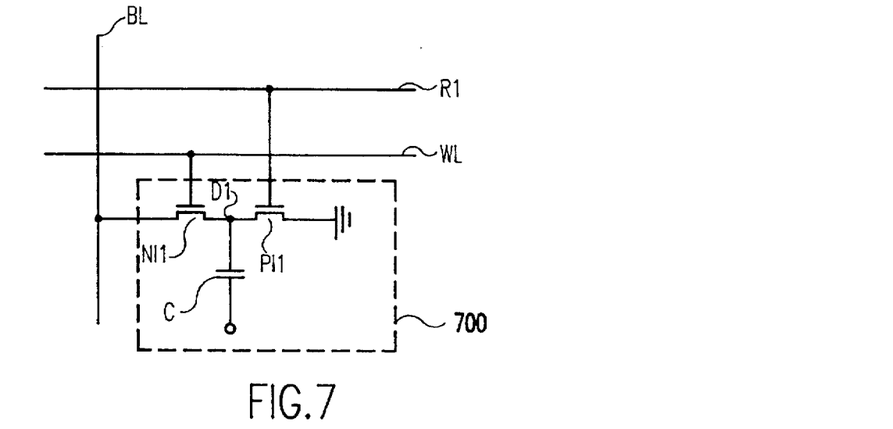
FIG. 7 is a circuit diagram of a DRAM device showing a seventh embodiment according to the present invention.

FIG. 7 is a circuit diagram showing a seventh embodiment in which the present invention is applied to a DRAM device. In a manner similar to the configuration shown in FIG. 5, a memory cell 700 is constructed such that an N channel MOS transistor N12 is provided therein and the drain, gate and source thereof are respectively electrically connected to a memory cell node D1, a set/reset line R1 and a ground potential Gnd.

When the DRAM device shown in FIG. 7 is activated in a normal mode, the set/reset line R1 is supplied with the ground potential Gnd. On the other hand, when the set/reset line R1 is supplied with a source potential Vdd, the transistor N12 is turned on to supply an "L" level to the memory cell node D1 from the source of the transistor N12, whereby the resetting of "0" to the memory cell is carried out.

Figure 8:
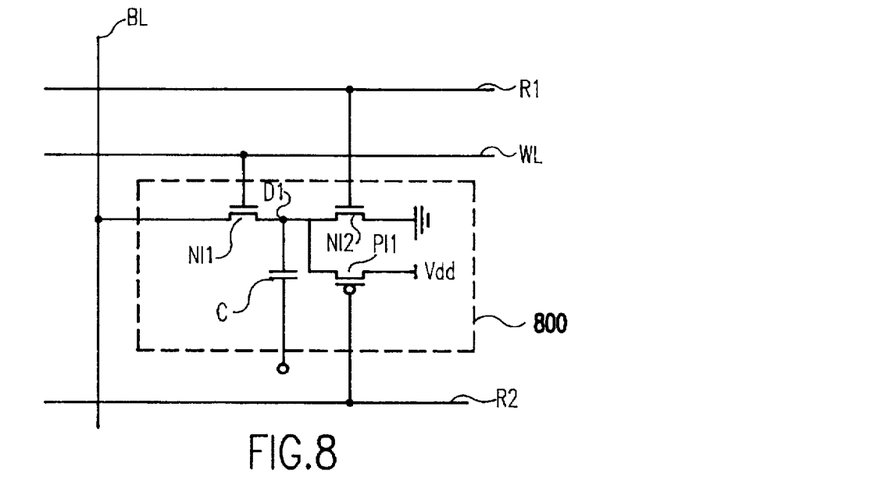
FIG. 8 is a circuit diagram of a DRAM device illustrating an eighth embodiment according to the present invention.

FIG. 8 is a circuit diagram showing an eighth embodiment in which the present invention is applied to a DRAM device. In the present embodiment, each DRAM memory cell 800 is provided with a pair of set/reset lines R1 and R2 provided so as to correspond to each word line WL, a set/reset N channel MOS transistor N12 connected in a manner similar to the configuration shown in FIG. 5, and a set/reset P channel MOS transistor P11 connected in a manner similar to the configuration shown in FIG. 6.

When the DRAM device shown in FIG. 8 is activated in a normal mode such as the writing of information into each memory cell and reading of it therefrom, the set/reset lines R1 and R2 are respectively supplied with a ground potential Gnd and a source potential Vdd so that the transistors N12 and P11 are brought into non-conduction.

Upon setting/resetting, all the word lines WL are first brought into a non-selected state. If the set/reset line R1 is set to the source potential Vdd while the set/reset line R2 remains held at the source potential Vdd, then the transistor N12 is brought into conduction so that an "L" level is supplied to a memory cell node D1 from the source of the transistor N12, whereby the resetting of "0" to the memory cell is carried out.

On the other hand, if the set/reset line R2 is set to the ground potential Gnd while the set/reset line R1 remains at the ground potential Gnd, then the transistor P11 is brought into conduction so that an "H" level is supplied to the memory cell node D1 from the source of the transistor P11, whereby the setting of "1" to the memory cell is performed.

As has been described above, a SRAM device according to the present invention has an advantage in that since set/reset information is directly written into transistors provided within each memory cell, the setting or resetting state within each memory cell can be realized by simply increasing the number of set/reset lines without an increase in the number of the elements, i.e., an increase in layout area.

Further, a DRAM device according to the present invention has an advantage in that when a set or reset device is placed under non-operation, the DRAM device is used as a random-erasable memory device, using the simplest circuit, and when it is necessary to write a predetermined value into the DRAM device, the DRAM device is supplied with a signal so that the predetermined value can be written therein.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory device comprising:
   a plurality of word lines;
   a plurality of bit lines;
   a plurality of set/reset lines;
   a plurality of switch circuits each of which is coupled to one of said set/reset lines for applying either a first potential or a second potential in response to a control signal; and
   a plurality of memory cells for storing data therein, each of said memory cells having
      a first node coupled to one of said word lines,
      a second node coupled to one of said bit lines,
      a third node coupled to receive the first potential, and
      a forth node coupled to one of said set/reset lines.

2. A semiconductor memory device according to claim 1, wherein said memory cells are SRAM memory cells.

3. A semiconductor memory device according to claim 2, wherein said set/reset lines includes first and second set/reset lines and the fourth node includes a first connection node coupled to one of the first set/reset lines and a second connection node coupled to one of the second set/reset lines.

4. A semiconductor memory device according to claim 3, wherein said switch circuits apply a first potential to the first set/reset lines and a second potential to the second set/reset lines in response to the control signal.

5. A semiconductor memory device according to claim 3, wherein said switch circuits apply the second potential to the first and second set/reset lines when the memory device operates in a normal mode.

6. A semiconductor memory device comprising:
   a plurality of word lines;
   a plurality of pairs of bit lines;
   a plurality of pairs of set/reset lines;
   a plurality of switch circuits each of which is coupled to one of said pairs of set/reset lines for applying either a first potential or a second potential in response to a control signal; and
   a plurality of memory cells for storing data therein, each of said memory cells having
      a first and a second nodes coupled to one of said word lines,
      a third and a fourth nodes coupled to one of said pairs of bit lines,
      a fifth and a sixth nodes coupled to a source of the first potential, and
      a seventh and an eighth nodes coupled to one of said pairs of set/reset lines.

7. A semiconductor memory device according to claim 6, wherein each of said pairs of set/reset lines includes a first set/reset line and a second set/reset line, and said switch circuits apply the first potential to the first set/reset lines and the second potential to the second set/reset lines in response to the control signal.

8. A semiconductor memory device according to claim 7, wherein said switch circuits apply the second potential to the first and second set/reset lines when the memory device operates in a normal mode.

9. A semiconductor memory device according to claim 6, wherein each of said switch circuits includes
   a first CMOS switch coupled between the first set/reset line and the source of the first potential,
   a second CMOS switch coupled between the first set/reset line and a source of the second potential,
   a third CMOS switch coupled between the second set/reset line and the source of the first potential, and
   a fourth CMOS switch coupled between the second set/reset line and the source of the second potential.

10. A semiconductor memory device according to claim 7, wherein each of said switch circuits includes
    a first gate circuit having a first input node coupled to receive the control signal, a second input node coupled to receive a normal operation signal and an output node coupled to the first set/reset line, and
    a second gate circuit having a first input node coupled to receive an inverted signal of the control signal, a second input node coupled to receive the normal operation signal and an output node coupled to the second set/reset line.

11. A semiconductor memory device according to claim 10, wherein the first and second gate circuits output signals having the second potential when the normal operation signal is in an active mode.

12. A semiconductor memory device according to claim 6, wherein the first potential is a source potential and the second potential is a ground potential.

13. A semiconductor memory device according to claim 6, wherein the first potential is a ground potential and the second potential is a source potential.

14. A semiconductor memory device comprising:

a plurality of word lines;

a plurality of bit lines;

a plurality of set/reset lines;

a plurality of switch circuits each of which is coupled to one of said set/reset lines for applying either a first potential or a second potential in response to a control signal; and a plurality of memory cells for storing data therein, each of said memory cells having a transfer transistor having a first terminal coupled to one of said bit lines, a second terminal and a gate coupled to one of said word line, a capacitor having a first terminal coupled to the second terminal of the transfer transistor and a second terminal coupled to receive a fixed potential, and a set/reset transistor having a first terminal coupled to the second terminal of the transfer transistor, a second terminal coupled to receive either the first potential or the second potential and a gate coupled to one of said set/reset lines.

15. A semiconductor memory device according to claim 14, wherein the second terminal of the set/reset transistor is coupled to receive the first potential.

16. A semiconductor memory device according to claim 14, wherein the second terminal of the set/reset transistor is coupled to receive the second potential.

17. A semiconductor memory device according to claim 14, wherein said set/reset lines includes a first and a second set/reset lines, and the set/reset transistor including a first set/reset transistor having a first terminal coupled to the second terminal of the transfer transistor, a second terminal coupled to receive the first potential and a gate coupled to the first set/reset line and a second set/reset transistor having a first terminal coupled to the second terminal of the transfer transistor, a second terminal coupled to receive the second potential and a gate coupled to the second set/reset line.

* * * * *